United States Patent [19]

Gregor et al.

[11] Patent Number: 5,760,627
[45] Date of Patent: Jun. 2, 1998

[54] LOW POWER CMOS LATCH

[75] Inventors: Roger Paul Gregor, Endicott; Gary Francis Yenik, Binghamton, both of N.Y.

[73] Assignee: International Business Machines Corporation, Armonk, N.Y.

[21] Appl. No.: 614,123

[22] Filed: Mar. 12, 1996

[51] Int. Cl.[6] .................................................. H03K 3/356
[52] U.S. Cl. ........................... 327/215; 327/212; 327/203
[58] Field of Search ..................................... 327/215, 217, 327/218, 202, 203, 208, 212, 210, 211; 326/97; 371/22.3

[56] References Cited

U.S. PATENT DOCUMENTS

| | | | |
|---|---|---|---|
| 3,812,384 | 5/1974 | Skorup | 327/217 |
| 4,554,664 | 11/1985 | Schultz . | |
| 4,669,061 | 5/1987 | Bhavsar . | |
| 4,728,823 | 3/1988 | Kinoshita . | |
| 4,843,264 | 6/1989 | Galbraith | 327/210 |
| 5,032,783 | 7/1991 | Hwang et al. . | |
| 5,036,217 | 7/1991 | Rollins et al. | 327/203 |
| 5,170,074 | 12/1992 | Aoki | 327/203 |
| 5,384,493 | 1/1995 | Furuki | 327/215 |
| 5,465,060 | 11/1995 | Pelella | 327/203 |
| 5,469,079 | 11/1995 | Mahant-Shetti et al. | 327/203 |
| 5,508,648 | 4/1996 | Banik | 327/203 |
| 5,532,634 | 7/1996 | Sato | 327/203 |
| 5,552,737 | 9/1996 | Chen | 327/203 |

*Primary Examiner*—Terry Cunningham
*Assistant Examiner*—Eunja Shin
*Attorney, Agent, or Firm*—Whitham, Curtis & Whitham; Arthur J. Samodovitz

[57] ABSTRACT

A latch comprises first and second NFETs and a first inverter. Data is applied without inversion to the gate of the first NFET and via the first inverter to the gate of the second NFET. A third NFET has a drain connected to the sources of the first and second NFETs. A clock is applied to the gate of the third NFET. Thus, there is only one NFET subject to the constant switching the clock, and therefore the constant power dissipation caused by the clock. To latch the data from the first and second NFETS, first and second inverters are connected in paralle with each other such that the output of each inverter is connected to the input of the other inverter. The input of one of the inverters is connected to the drain of the first NFET and the input of the other inverter is connected to the drain of the second NFET. A second stage of latching is also disclosed.

2 Claims, 9 Drawing Sheets

LOW POWER CMOS LATCH

BACKGROUND OF THE INVENTION

The invention relates generally to design of latches using complimentary metal oxide semiconductor (CMOS) field effect transistors (FETs), and deals more particularly with design of such latches which minimize power dissipation.

CMOS technology is well known in the industry to provide low power FETs. Each FET has a drain, source and gate and is activated by application of a voltage from the gate to source.

The electric field of this voltage opens a channel within the FET to permit current to pass. The wider the channel, the more the current which can pass through but the greater the capacitance. Due to the intrinsic nature of an FET, power is only dissipated during switching and the greater the capacitance, the longer the switching time and consequently, the greater the power dissipation.

An N-channel FET (NFET) is activated by a positive voltage from gate to source and conversely, a P-channel FET (PFET) is activated by a negative voltage from gate to source. Typically, NFETs have higher gain than PFETs because the electron carriers of the NFETs have higher mobility than the hole carriers of the PFETs. The gain of both the NFET and the PFET is a function of the magnitude of the gate to source voltage, the higher the differential, the greater the gain. The maximum gain of an NFET is achieved by operating the NFET with its source grounded and the gate controlled with a voltage level that is nearly the supply voltage. An NFET can also be operated in a source follower mode wherein the drain of the NFET is the data input and the source is the data output and is applied to another digital circuit. The source follower mode provides low gain when the data input is a logic one for the following reason. When the logic one is passed through to the source, the source must output a substantial positive voltage, and even if the gate is controlled with a voltage level that is nearly the supply voltage, the gate to source differential is much smaller than in the source grounded configuration.

With the gain maximized in the source grounded configuration, for a given current requirement, the channel width can be minimized. The minimum channel width also minimizes the resultant capacitance and therefore the switching time and power dissipation of the NFET. Consequently, to minimize switching time and power dissipation of a CMOS device, it is desirable to utilize NFET devices (and not PFET devices) with minimum channel width permitted by the current requirement and gain, and operate the NFETs in the source grounded configuration to maximize gain. Also, the amount of switching should be minimized because power is only dissipated during switching.

Latches are widely used in semiconductor circuits to read in or latch a digital input level, to be read out later. It was known to form latches using CMOS transistors. There are many types of known latches which use CMOS transistors. A first type of prior art Level Sensitive Scan Design (LSSD), two stage latch 18 is illustrated in FIG. 1. During normal operation, input data 20 is applied to an inverter 21 and the output of the inverter is applied to the drain of an NFET 22. The gate of the NFET is controlled by a "Cclock" 24 and the source of the NFET is applied to an inverter 26. Inverter 26 along with a feedback inverter 28 provide the latching of the input data which is passed through NFET 22 by means of Cclock 24. While this design is simple, NFET 22 is connected in a source follower mode and provides low gain when the input data is a logic one. Consequently, the channel of NFET 22 must be wide to provide the requisite output current for the high level, and as result, the capacitance is high, the switching speed of NFET 22 is slow and the power dissipation is high.

When it is necessary to read out the input data latched into inverters 26 and 28, a Bclock 30 activates NFET 32 and the input data is passed through and latched in inverters 36 and 38.

NFET 32 is also connected in the source follower mode and has a wide channel, high capacitance, slow switching speed and substantial power dissipation.

Prior art latch 18 can also be operated in a test mode in which scan data 40 is read into inverters 26 and 28 via NFET 42, instead of normal input data 20. NFET 42 is also connected in the source follower mode and consequently has a wide channel, high capacitance, slow switching speed and substantial power dissipation. NFET 42 is controlled by Aclock 46 instead of Cclock 24. The Bclock 30 is used to read the scan data into inverters 28 and 30.

FIG. 2 illustrates another prior art, two stage latch generally designated 50. Latch 50 is identical to latch 18 with similarly labeled components except that latch 50 includes the following additional components. Cclock 24 is also applied through an inverter 60 to the gate of a PFET 62, Bclock 30 is also applied through an inverter 64 to the gate of a PFET 66 and Aclock 46 is also applied through an inverter 68 to the gate of a PFET 70. These additional inverters and PFETs provide higher gain than the respective NFETs while passing the logic one through because the gate is driven with nearly ground voltage and the logic one output is 100% of the supply voltage. Therefore, the complimentary NFET is not required to generate the requisite output current and the channel of the NFET does not have to be as wide as in latch 18. Consequently, the operating speed of latch 50 is faster than latch 18. Improvements are still desired to further reduce the capacitance and increase the switching speed.

FIG. 3 illustrates yet another prior art, two stage latch generally designated 80. Latch 80 includes the inverters 26,28 and 36,38 and clocks 24, 30 and 46, input data 20 and scan data 40 as in latches 18 and 50. However, latch 80 includes NFETs connected in the high gain, source grounded mode (instead of the source follower mode as in latches 18 and 50) as follows. The input data is applied directly to the gate of NFET 82 and via an inverter 84 to the gate of NFET 86. Cclock 24 is applied directly to the gates of NFETs 90 and 92. When Cclock 24 is high, both NFETs 90 and 92 are activated and this permits meaningful activation of NFETs 82 and 86. If the input data 20 is high, this activates NFET 82 which brings the input to inverter 26 low and the output of inverter 26 high. Thus, the input data is latched into inverters 26 and 28. Conversely, if the input data 20 is low, this activates NFET 86 which brings the input to inverter 28 low and the output of inverter 26 low.

The output of inverter 26 is applied directly to the gate of NFET 93 and via inverter 28 to the gate of NFET 94. Bclock 30 is applied directly to the gates of NFETs 95 and 96. When Bclock 30 is high, both NFETs 95 and 96 are activated and this permits meaningful activation of NFETs 93 and 94. If the output of inverter 26 is high, this activates NFET 93 which brings the input to inverter 36 low and the output of inverter 36 high. Thus, the input data is latched into inverters 36 and 38. Conversely, if the output of inverter 26 is low, this activates NFET 94 which brings the input to inverter 38 low and the output of inverter 36 low.

The scan data 40 is applied directly to the gate of NFET 102 and via an inverter 104 to the gate of NFET 106. Aclock 46 is applied directly to the gates of NFETs 110 and 112. When Aclock 46 is high, both NFETs 110 and 112 are activated and this permits meaningful activation of NFETs 102 and 106. If the scan data 40 is high, this activates NFET 102 which brings the input to inverter 26 low and the output of inverter 26 high. Thus, the scan data is latched into inverters 26 and 28. Conversely, if the scan data 40 is low, this activates NFET 106 which brings the input to inverter 28 low and the output of inverter 26 low. While latch 80 utilizes only NFETs for the input data, scan data and clock controls, and all of these NFETs are connected in the high gain, source grounded mode, improvements are desirable to reduce the total number of NFET switching operations. This is because each NFET switching operation dissipates some power, even when the capacitance is low.

Accordingly, a general object of the present invention is to provide a latch with minimal power dissipation.

A more specific object of the present invention is to provide an LSSD latch of the foregoing type which utilizes source grounded NFETs for data input and clock controls and reduces the number of NFET switching operations compared to the prior art.

SUMMARY OF THE INVENTION

The invention resides in a latch comprising first and second NFETs and a first inverter. Data is applied without inversion to the gate of the first NFET and via the first inverter to the gate of the second NFET. A third NFET has a drain connected to the sources of the first and second NFETs. A clock is applied to the gate of the third NFET. Thus, there is only one NFET subject to the constant switching by the clock, and therefore the constant power dissipation caused by the clock. To latch the data from the first and second NFETS, first and second inverters are connected in parallel with each other such that the output of each inverter is connected to the input of the other inverter. The input of one of the inverters is connected to the drain of the first NFET and the input of the other inverter is connected to the drain of the second NFET.

If a second stage of latching is required, fourth and fifth NFETs are also provided. An output of one of the inverters is connected to the gate of the fourth NFET and an output of the other inverter is connected to the gate of the fifth NFET. A sixth NFET has a drain connected to the sources of the fourth and fifth NFETs. A second clock input is connected to the gate of the sixth NFET. Thus, there is only one NFET subject to the constant switching by the second clock, and therefore the constant power dissipation caused by the second clock. To latch the data from the fourth and fifth NFETs, third and fourth inverters are connected in parallel with each other such that the output of the third inverter is connected to the input of the fourth inverter and the output of the fourth inverter is connected to the input of the third inverter. The input of one of the third or fourth inverters is connected to the drain of the fourth NFET and the input of the other of the third or fourth inverters is connected to the drain of the fifth NFET.

DETAILED DESCRIPTION OF THE PREFERRED EMBODIMENTS

Figure 1:
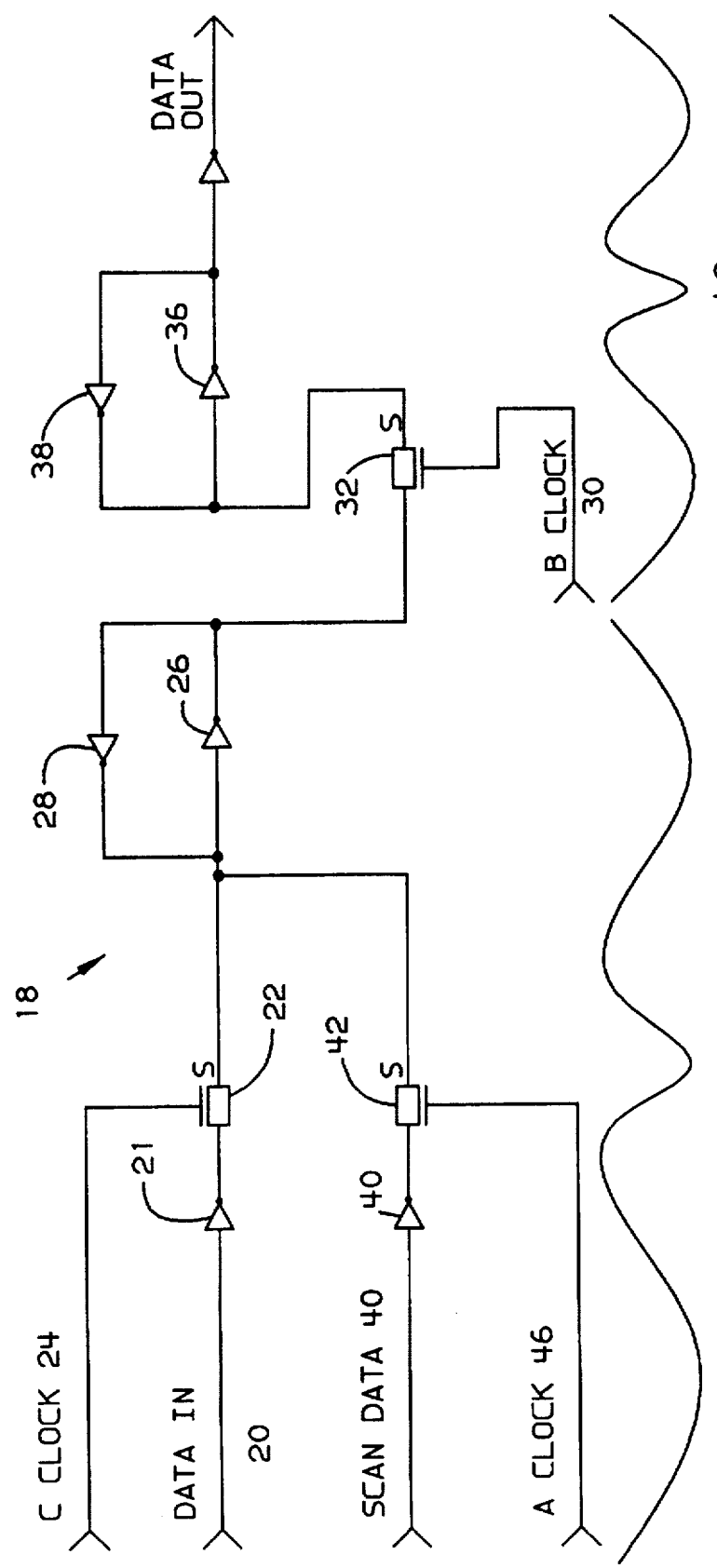
FIG. 1 is a circuit diagram of a two stage latch according to the prior art.
Figure 2:
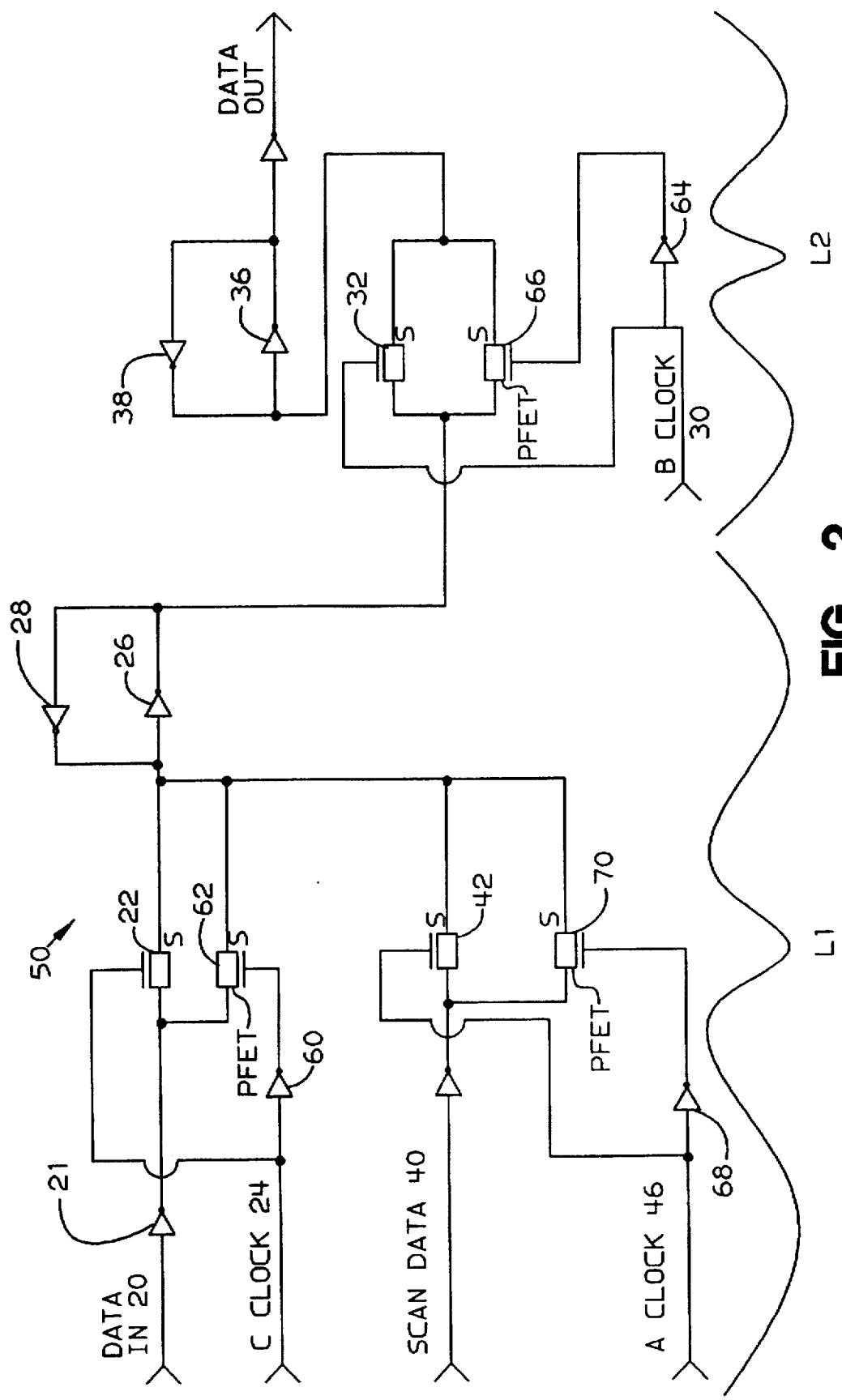
FIG. 2 is a circuit diagram of another two stage latch according to the prior art.
Figure 3:
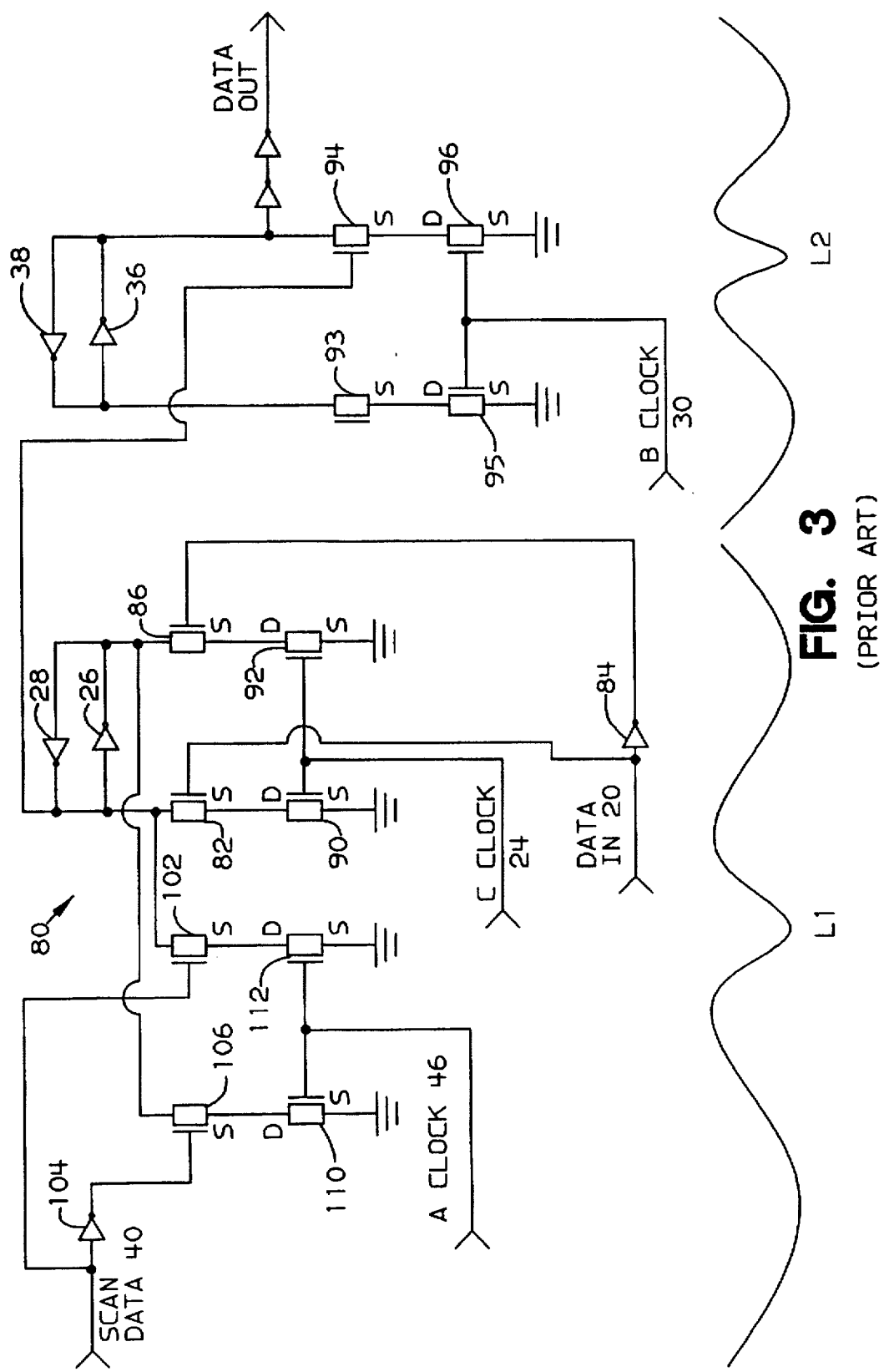
FIG. 3 is a circuit diagram of still another two stage latch according to the prior art.
Figure 4:
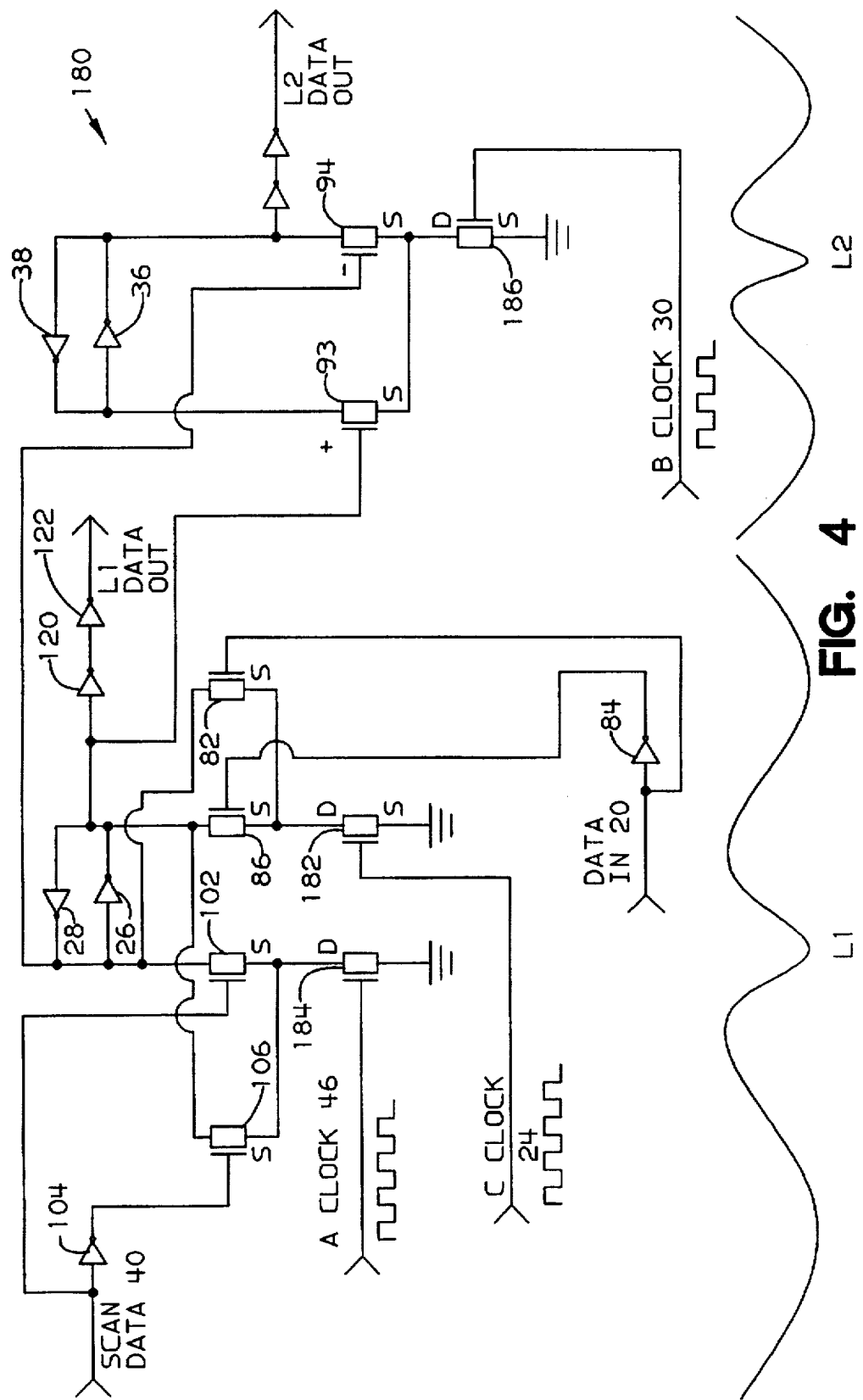
FIG. 4 is a circuit diagram of a two stage latch according to the present invention.

Referring now to the remaining FIGS. 4–9, wherein like reference numbers indicate like elements throughout these and the preceding Figures, FIG. 4 illustrates a two stage latch generally designated 180 according to the present invention. Latch 180 is identical to prior art latch 80 except for the following. For the Cclock control, latch 180 omits NFETs 90 and 92 of latch 80 and substitutes a single NFET 182 whose drain is connected to the sources of both NFETs 82 and 86. Likewise, for the Aclock control, latch 180 omits NFETs 110 and 112 of latch 80 and substitutes a single NFET 184 whose drain is connected to the sources of both NFETs 102 and 106. Likewise, for the Bclock control, latch 180 omits NFETs 95 and 96 of latch 80 and substitutes a single NFET 186 whose drain is connected to the sources of both NFETs 93 and 94.

Consequently, latch 180 has three less NFETs than latch 80 and more importantly, three less NFETs involved in the constant switching caused by the repetitive clock signals from clocks 24, 30 and 46. This reduces power dissipation significantly because in FET transistors, power is only dissipated during switching. Yet, the data input and clock control NFETs (82, 86, 182, 93, 94, 186, 102, 106 and 184) of latch 180 are all source grounded and latch 180 performs the requisite function. Typically, the input data 20 and the scan data 40 do not change as often as the clock signals, so the switching involved with NFETs 82, 86, 93, 94, 102 and 106 does not cause a large amount of power dissipation.

FIG. 4 also illustrates an optional data output circuit comprising two inverters 120 and 122 connected to the output of inverter 26.

Figure 5:
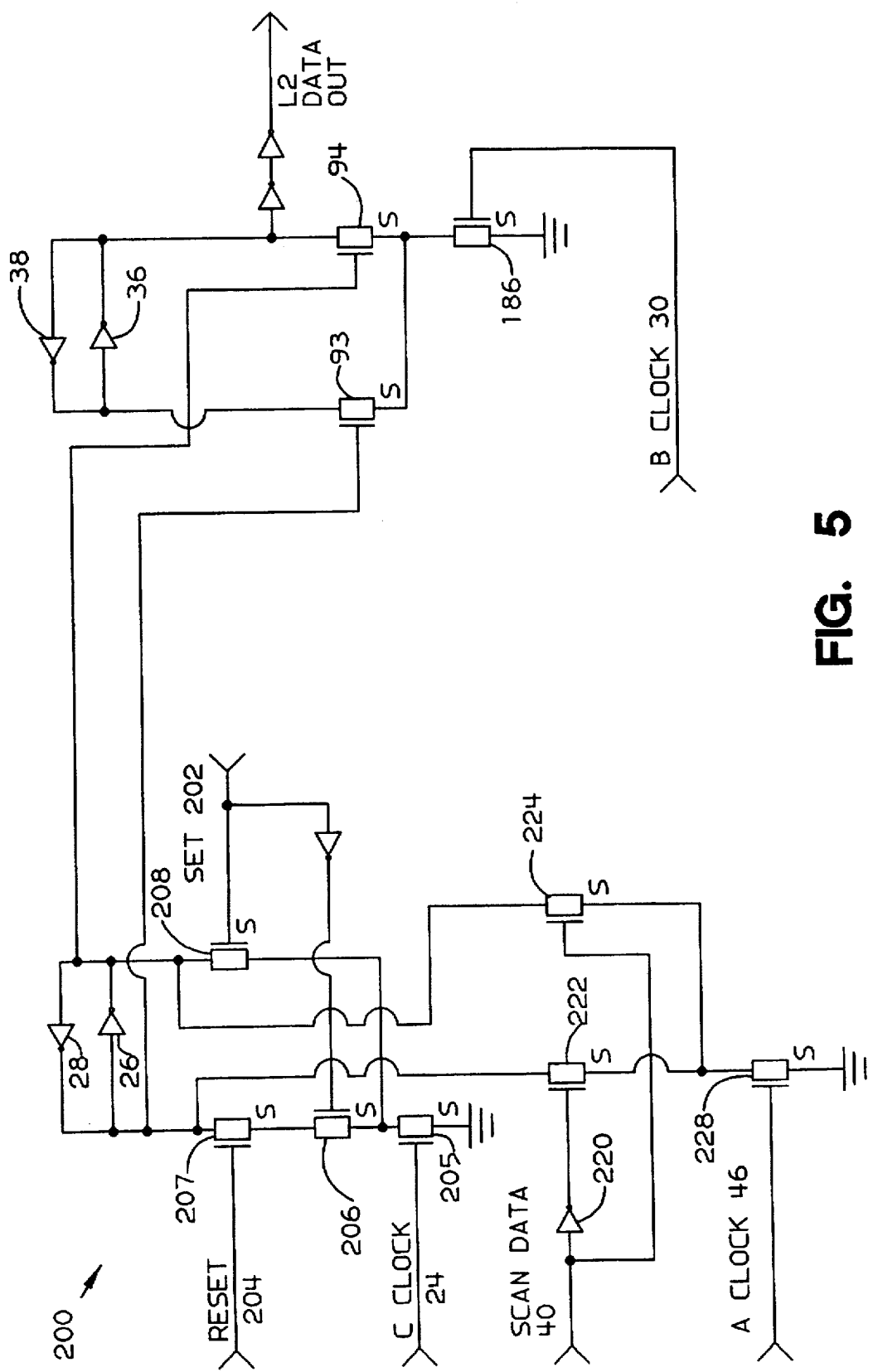
FIG. 5 is a circuit diagram of another two stage latch according to the present invention.

FIG. 5 illustrates another two stage latch generally designated 200 according to the present invention. Latch 200 is a Set Dominant Synchronous Set Reset Latch. The basic function is as follows. If a set input 202 is high when the latch is clocked, the latch will read in a high level. Conversely, if a reset input 204 is high when the latch is clocked, the latch will read in a low level. If neither the set nor the reset input is high when the latch is clocked, the latch will retain its current value.

The following describes the implementation of latch 200 in more detail. Cclock 24 controls the gate of NFET 205, and the drain of NFET 205 is connected to the sources of NFETs 206 and 208. When Cclock 24 is high, this permits meaningful activation of NFETs 206 and 208.

When the set input 202 is high, NFET 208 is activated and (if Cclock 24 is still high) a low level is applied to the input of inverter 28 and the output of inverter 26. In latch 200, the output of inverter 26 is connected to the gate of NFET 94 (instead of the gate of NFET 93 as in latch 180) so that a high level will be latched into inverters 36 and 38 when the Bclock 30 is high. When the reset input 204 is high (if Cclock 24 is still high and the set input is low), NFET 207 is activated and a low level is applied to the input of inverter 26, and inverter 26 outputs a high level. In latch 200, the output of inverter 28 is connected to the gate of NFET 93 (instead of the gate of NFET 94 as in latch 180) so that a low level will be latched into inverters 36 and 38 when the Bclock 30 is high. If neither the set input 202 nor the reset input 204 is high when Cclock 24 is high, then neither NFET 204 nor 208 is active and there is no change to the states of inverters 26 and 28.

Scan data 40 is applied directly to the gate of NFET 224 and through an inverter 220 to the gate of NFET 222. The sources of both NFETS 222 and 224 are connected to the drain of NFET 228. Aclock 46 controls the gate of NFET 228. When Aclock 46 is high, NFET 228 is active and this permits meaningful activation of NFETs 222 and 224. If the scan data 40 is high, NFET 224 will be activated and cause a low level to be applied to the input of inverter 28. Inverter 26 will output a low level. Conversely, if the scan data 40 is low, NFET 222 will be activated and cause a low level to be applied to the input of inverter 26. Inverter 26 will output a high level.

Figure 6:
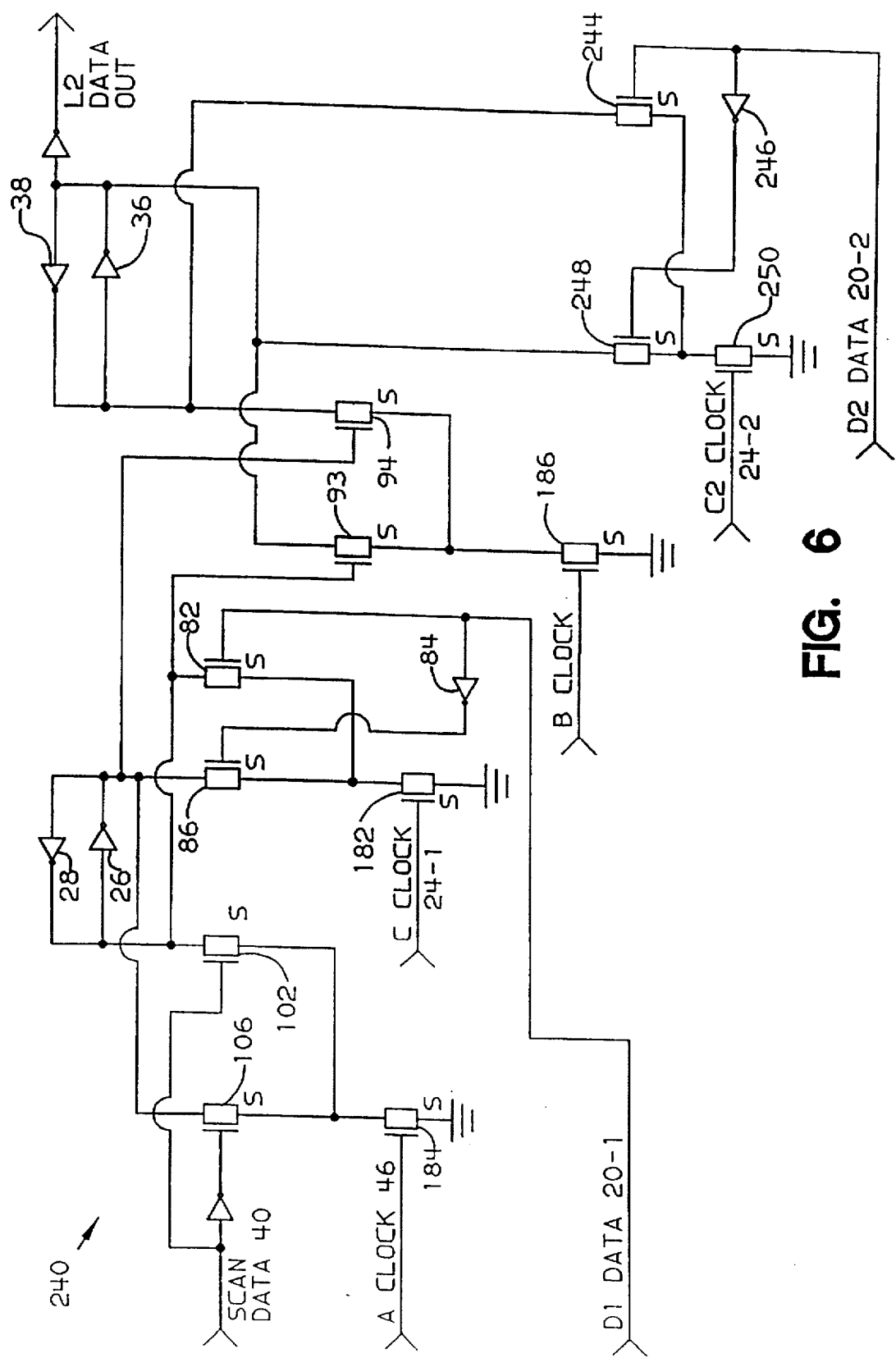
FIG. 6 is a circuit diagram of another two stage latch according to the present invention.

FIGS. 6 illustrates another, multiport latch generally designated 240 according to the present invention. Latch 240 is identical to latch 180 except latch 240 has two possible data inputs 20-1 and 20-2 two respective Cclocks - C1clock 24-1 and C2clock 24-2, instead of just one data input 20 and one Cclock 24 of latch 180. The second data input 20-2 is applied to the second stage of latching. Therefore, latch 240 requires an additional set of NFETs to process the second data input 20-2 under control of the second Cclock 24-2. Data input 20-2 is applied directly to the gate of an NFET 244 and through an inverter 246 to the gate of an NFET 248. The drains of NFETs 244 and 248 are connected to the inputs of inverters 36 and 38, respectively. C2clock 24-2 is applied to the gate of an NFET 250 whose drain is connected to the sources of two NFETs 244 and 248. Thus, when C2clock 24-2 is high, NFET 250 conducts and permits meaningful activation of NFETs 244 and 248. When data input 20-2 is high (and C2clock 4-2 is high), NFET 244 conducts causing a low level to be applied to the input of inverter 36 and a high level to result at the output of inverter 36. Conversely when data input 20-2 is low (and C2clock 24-2 is high), NFET 248 is activated and causes a low to appear at the input of inverter 38 and at the output of inverter 36.

Figure 7:
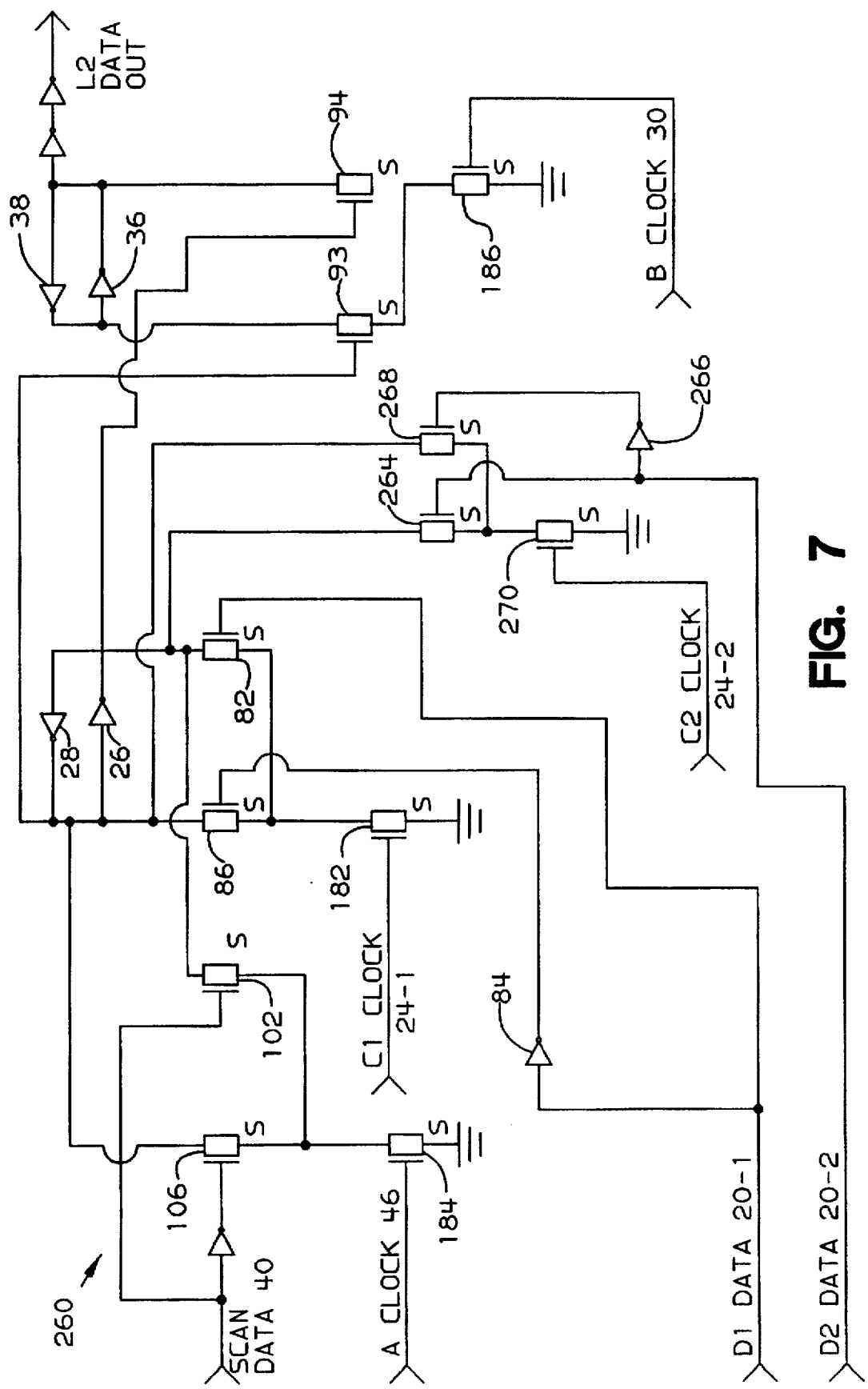
FIG. 7 is a circuit diagram of another two stage latch according to the present invention.

FIG. 7 illustrates another, multiport latch generally designated 260 according to the present invention. Latch 260 is identical to latch 180 except latch 260 has two possible data inputs 20-1 and 20-2 and two Cclocks - C1clock 24-1 and C2clock 24-2, instead of just one data input 20 and one Cclock 24 of latch 180. (Unlike latch 240, the second data input 20-2 of latch 260 is applied to the first stage of latching.) Latch 260 requires an additional set of NFETs to process the second data input under control of the second Cclock. Data input 20-2 is applied directly to the gate of an NFET 264 and through an inverter 266 to the gate of an NFET 268. C2clock 24-2 is applied to the gate of an NFET 270 whose drain is connected to the sources of both NFETs 264 and 268. The drains of NFETs 264 and 268 are connected to the inputs of inverters 28 and 26 respectively. Thus, when C2clock 24-2 is high, NFET 270 conducts and permits meaningful activation of NFETs 264 and 268. When data input 20-2 is high (and C2clock 24-2 is high), NFET 264 conducts causing a low level to be applied to the input of inverter 28 and a low level to result at the output of inverter 26. As in latch 200, the output of inverter 26 is connected to the gate of NFET 94. Conversely when data input 20-2 is low (and C2clock 24-2 is high), NFET 268 is activated and this causes a low to appear at the input of inverter 26 and a high level to occur at the output of inverter 26.

Figure 8:
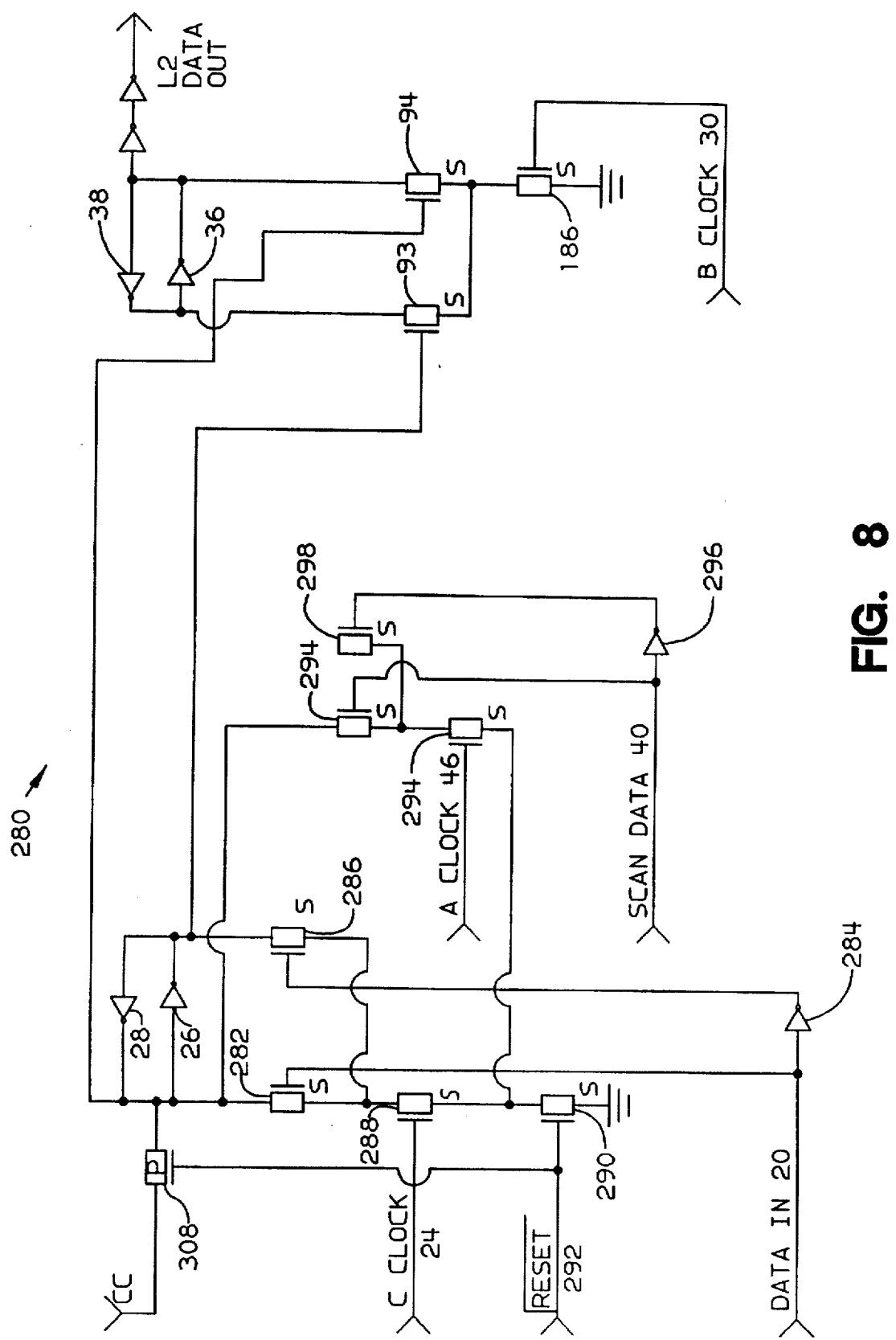
FIG. 8 is a circuit diagram of another two stage latch according to the present invention.

FIG. 8 illustrates another, asynchronous reset latch generally designated 280 according to the present invention. The basic function of a reset input is as follows. The reset input resets the output to logic zero irrespective of the current state of the latch or the data input to the latch.

The following describes the implementation in more detail. Data input 20 is applied directly to the gate of NFET 282 and via an inverter 284 to the gate of NFET 286. Cclock 24 is applied to the gate of NFET 288. The drain of NFET 288 is connected to the sources of both NFETs 282 and 286. However, the source of NFET 288 is connected to the drain of NFET 290, and a Reset Not signal 292 is applied to the gate of NFET 290. Scan data 40 is applied directly to the gate of NFET 294 and via an inverter 296 to the gate of NFET 298. Aclock 46 is applied to the gate of NFET 299. The drain of NFET 299 is connected to the sources of NFETS 294 and 298. The source of NFET 299 is connected to the drain of NFET 290. As noted above, the Reset Not signal 292 is applied to the gate of NFET 290. Thus, irrespective of the values of Cclock 24 and data input 20, and the values of Aclock 46 and scan data 40, if the RESET NOT signal is low, neither the data path nor scan path can change the latch. However, a low RESET NOT signal activates PFET 300 which puts a high level on the input of inverter 26 which results in a low level at the output of inverter 26.

Figure 9:
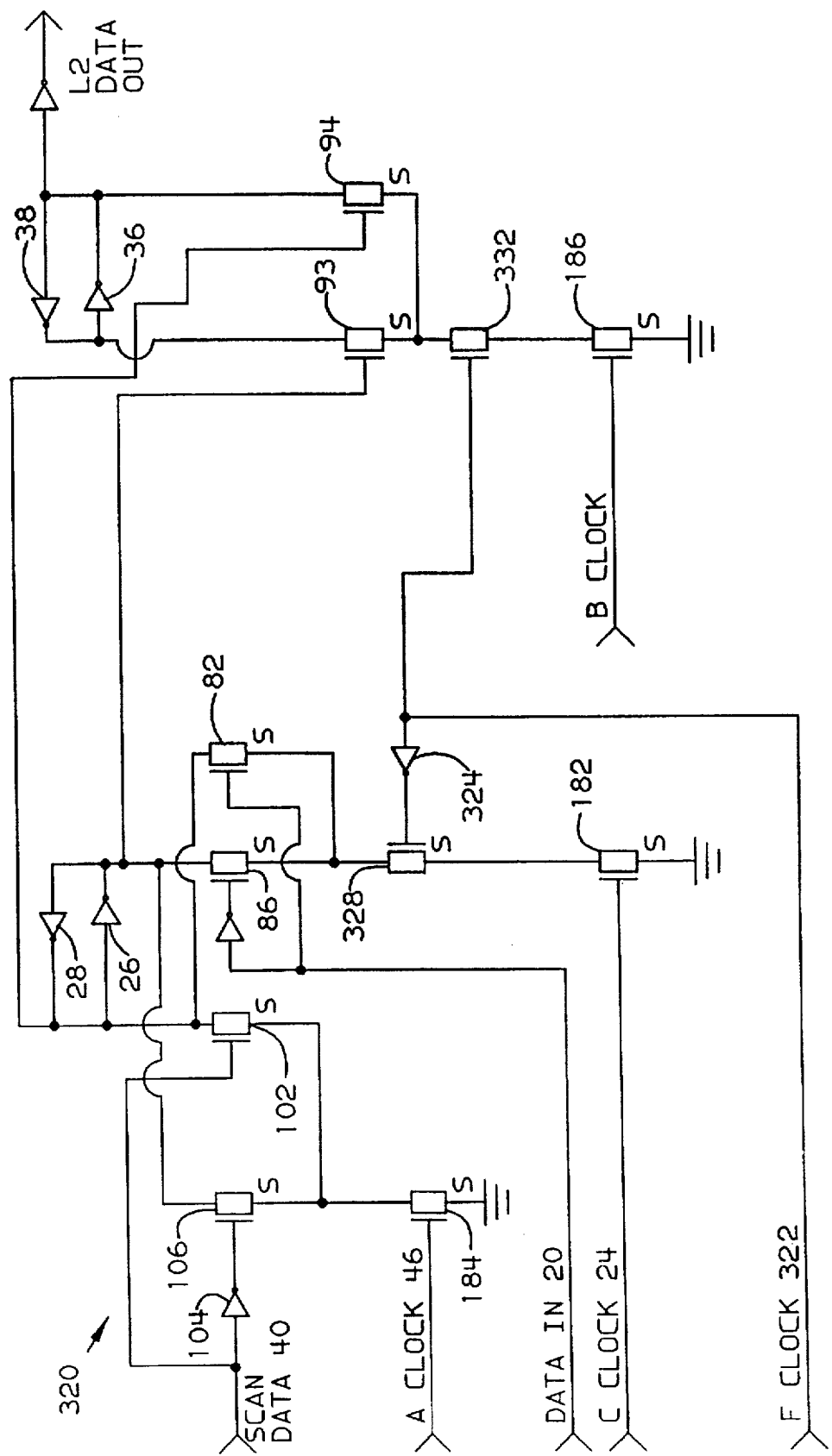
FIG. 9 is a circuit diagram of another two stage latch according to the present invention.

FIG. 9 illustrates another, D Mimic latch generally designated 320 according to the present invention. Latch 320 is identical to latch 180 except for the following. An Eclock 322 is connected via an inverter 324 to the gate of NFET 328, and NFET 328 is inserted between the sources of NFETs 82 and 86 and the drain of NFET 182, controlled by Cclock 24. Thus, the input data 20 will not be read into the latch unless both the Cclock 24 is high and the Eclock 322 is low. The Eclock 322 is also applied to the gate of NFET 332. NFET 332 is inserted between the sources of both NFETs 93 and 94 and the drain of NFET 186. Thus, the value latched by inverters 26 and 28 will not be advanced to latches 36 and 38 unless the Bclock 30 is high and the Eclock 322 is high.

Based on the foregoing, latches according to the present invention have been disclosed. However, numerous modifications and substitutions can be made without deviating from the scope of the present invention. Therefore, the present invention has been disclosed by way of illustration and not limitation, and reference should be made to the following claims to determine the scope of the present invention.

We claim:

1. A latch comprising:
   a first pair of cross coupled inverters:
   first and second NFETs and a first inverter, a data input being connected to the input of said first inverter and the gate of said first NFET and the output of said first inverter being connected to the gate of said second NFET, the drain of said first NFET being coupled to a first output of said first pair of cross coupled inverters and said second NFET being coupled to a second output of said first pair of cross coupled inverters:
   a third NFET having its drain coupled to the sources of said first and second NFETs, a first clock being connected to the gate of said third NFET;

fourth and fifth NFETs and a second inverter, a scan data input being connected to the input of said second inverter and the gate of said fourth NFET and the output of said second inverter being connected to the gate of said fifth NFET, the drain of said fourth NFET being coupled to said first output of said first pair of cross coupled inverters and said fifth NFET being coupled to said second output of said first pair of cross coupled inverters;

a sixth NFET having a drain connected to the sources of said fourth and fifth NFETs, a scan clock being connected to the gate of said sixth NFET;

a second pair of cross coupled inverters;

seventh and eighth NFETs, said first output of said first pair of cross coupled inverters being connected to the gate of said seventh NFET and said second output of said first pair of cross coupled inverters being connected to the gate of said eighth NFET the drain of said seventh NFET being coupled to a first output of said second pair of cross coupled inverters and the drain of said eighth NFET being coupled to a second output of said second pair of cross coupled inverters;

a ninth NFET having its drain coupled to the sources of said seventh and eighth NFETs, a third clock being connected to the gate of said ninth NFET; and, means for selectively blocking data from being clocked into said first pair of cross coupled inverters or for blocking data latched in said first pair of cross coupled inverters from being passed to said second pair of cross coupled inverters.

2. The latch in claim 1 wherein the selective blocking means comprises:

a tenth NFET, the drain of the third NFET connected to the source of the tenth NFET and the sources of the first and second NFET connected to the drain of the tenth NFET;

an eleventh NFET, the drain of the ninth NFET connected to the source of the eleventh NFET and the sources of the seventh and eighth NFET connected to the drain of the eleventh NFET; and, a fourth inverter, a fourth clock being connected to the input of said fourth inverter and the gate of said eleventh NFET, the output of the fourth inverter being connected to the gate of the tenth NFET.

* * * * *